US005537051A

United States Patent [19]
Jalloul et al.

[11] Patent Number: 5,537,051
[45] Date of Patent: Jul. 16, 1996

[54] APPARATUS FOR TESTING INTEGRATED CIRCUITS

[75] Inventors: Suhail M. Jalloul, Delray Beach, Fla.; Jeffrey S. Whisenhunt, Fort Worth, Tex.; Gary A. Ramsay, Lauderhill, Fla.

[73] Assignee: Motorola, Inc., Schaumburg, Ill.

[21] Appl. No.: 427,507

[22] Filed: Apr. 24, 1995

[51] Int. Cl.⁶ ................................................. G01R 1/073
[52] U.S. Cl. .......................................... 324/758; 324/754
[58] Field of Search ................................... 324/754, 761, 324/758

[56] References Cited

U.S. PATENT DOCUMENTS

| | | | |
|---|---|---|---|
| 4,209,745 | 6/1980 | Hines | 324/761 |
| 4,322,682 | 3/1982 | Schadwill | 324/761 |
| 4,496,903 | 1/1985 | Paulinski | 324/761 |
| 4,573,009 | 2/1986 | Fowler et al. | 324/761 |
| 4,667,155 | 5/1987 | Coiner et al. | 324/761 |
| 4,700,132 | 10/1987 | Yarbrough et al. | 324/761 |
| 4,771,234 | 9/1988 | Cook et al. | 324/761 |
| 4,935,695 | 6/1990 | Hayes et al. | 324/761 |
| 4,977,370 | 12/1990 | Andrews | 324/761 |
| 5,015,946 | 5/1991 | Janko | 324/761 |

Primary Examiner—Ernest F. Karlsen
Attorney, Agent, or Firm—R. Louis Breeden

[57] ABSTRACT

A method and apparatus for testing integrated circuits by connecting a plurality of leads (25) of a device (10) to a test board (50). The test fixture (32) includes a test plate (70) having a plurality of test points (74) corresponding to the leads (25) of the device (10) and an alignment plate (60). The test points (74) are electrically connected to the test board (50) by a series of runners (76) extending from the test points (74) on the test plate (70) to a series of bumped finger pads (72) on the test plate (70). The bumped finger pads (72) of the test plate (70) are electrically connected to a series of bumped finger pads (54) on an active side (52) of the test board (50). The test plate (70) is fabricated of flex material. The alignment plate (60) is fabricated of flex material and is mounted on top of the test plate (70), so that the alignment plate (60) covers the runners (76), electrically insulating the runners (76). The alignment plate (60) includes a series of perforations (62) corresponding to the test points (74), such that the leads (25) of the device (10) fit securely into the perforations (62) and contact the test points (74). The method comprises inserting the device (10) onto the test fixture (32); aligning the leads (25) of the device (10) onto corresponding test points (74) of the test fixture (32), so that each test point (74) contacts a corresponding lead (25); and testing the device (10).

8 Claims, 4 Drawing Sheets

APPARATUS FOR TESTING INTEGRATED CIRCUITS

FIELD OF THE INVENTION

This invention relates in general to a method and apparatus for testing integrated circuits. More particularly, this invention relates to a method and apparatus for testing small pitch ball grid array, pin grid array, or other bumped integrated circuits using flex circuit technology.

BACKGROUND OF THE INVENTION

Continuing improvements in circuit design has lead to smaller and smaller integrated circuits used in electronic parts and equipment. These integrated circuits can have dimensions less than 2 cm$^2$ with pin counts over 100. It is increasingly important to test such parts accurately and at high speeds in order to keep up with the production rates of the parts.

Integrated circuits were first packaged in dual-in-line packages (DIPs), with leads coming out on either side forming two parallel rows. However, as integrated circuits became smaller and more complex, the number of leads necessary to access these circuits increased while the package size decreased.

A recent solution to this problem of putting a large number of leads on a small package are the ball grid array (BGA) and pin grid array (PGA) integrated circuit packages. These packages are generally flat and square. They have a large number of leads coming out of the bottom of the package, parallel to each other forming a grid array. The BGA and PGA packages can, for example, contain a pin count in the order of 143 in a 13×11 array with a 40 milli-inch (1.016 mm) pitch, or distance, between each ball or pin.

With these new smaller integrated circuit packages came the need for new testing techniques. Because the devices had leads coming straight out of the bottom of the package, in order to test the devices, the packages would need to be perpendicularly inserted into a test site which would make electrical contact with each of the leads for testing.

Current methods of testing these integrated circuit packages include a test site comprising a plurality of pogo pins within a series of holes in a cubical container, or socket, such as that described in U.S. Pat. No. 4,700,132 to Yarbrough et al., assigned to the assignee of the present invention and incorporated herein by reference. Pogo pins have contact heads which ride up and down on a tiny spring within the pogo pin housing. A cup-shaped contact head may be used to conform to the leads of the device-under-test (DUT). Each of the holes corresponds to and registers with the leads from a BGA or PGA device such that the leads come in contact with the pogo pins, providing the electrical connection to the printed circuit board (PCB) necessary for testing.

To test the integrated circuit, the device-under-test (DUT) is placed in a test fixture populated with pogo pins that will provide the contact between the device and the printed circuit board. The cubical pogo pin sockets are made of non-conductive plastic having a plurality of holes drilled within to house the pogo pins.

Problems arise with pogo pin testing when the pitch of the leads drops below 40 milli-inches (1.016 mm). At a 40 milli-inch pitch (1.016 mm), the manufacturability of the socket is at its limit due to thin walls between the holes and the tendency of the drill used to fabricate these holes to "walk" causing oversized or skewed holes. As the lead count on microprocessors increases leading to lower pitch BGA and PGA packages, the current method of testing using pogo pin sockets will not work, since the sockets can not be manufactured to these smaller specifications.

Another problem arises with the costs of manufacture and repair of pogo pins. Since each pogo pin includes moveable parts and springs, malfunctions arise when either the pin breaks or the hole in the socket becomes obstructed by dirt or other particles. Repair of a broken pogo pin is time consuming and costly. A broken pogo pin would result in inaccurate test results and mislabeling of the tested device as defective. Thus, a test fixture will sometimes reject a part as "bad" when in fact the part is good but did not make contact with the PCB either because of a broken pogo pin or an obstructed hole.

A solution to this problem would be to provide an inexpensive test fixture which eliminates the need for pogo pins to allow for testing of circuits with less than 40 milli-inch (1.016 mm) pitch, while still providing accurate and rapid testing of components. Another solution to these problems would be to provide a test fixture which is easily cleaned and not susceptible to collection of dirt which would lead to erroneous test results.

Thus, there is a need in the art for a method and apparatus for testing integrated circuits which eliminates the need for pogo pins to allow for testing of circuits with less than 40 milli-inch (1.016 mm) pitch, which is inexpensive, easily cleaned, and not susceptible to the collection of dirt.

DESCRIPTION OF THE PREFERRED EMBODIMENT

Figure 1:
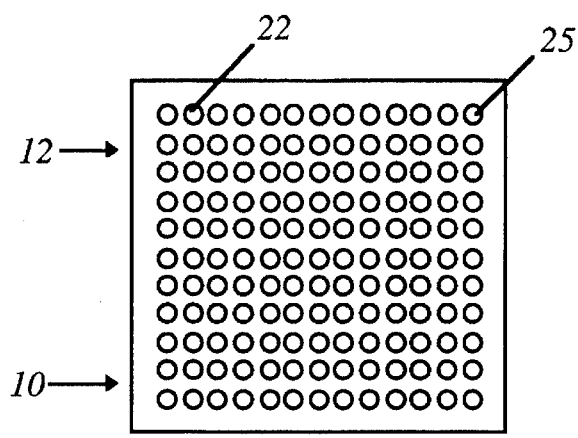
FIG. 1 is a plan view of the underside of a ball grid array integrated circuit package, the number and size of the leads not representative of an actual device.
Figure 2:
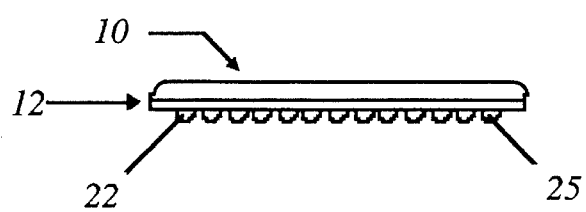
FIG. 2 is a side view of the ball grid array integrated circuit package of FIG. 1.
Figure 3:
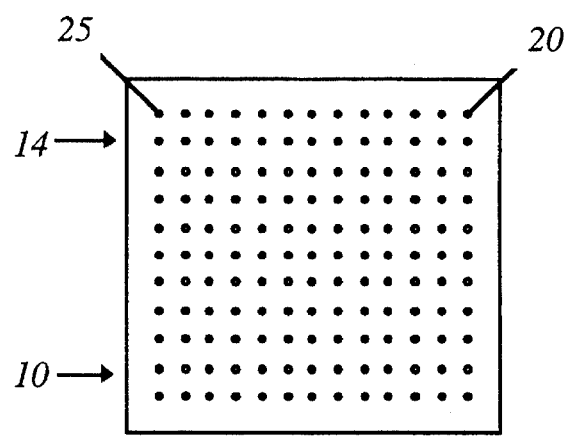
FIG. 3 is a plan view of the underside of a pin grid array integrated circuit package, the number and size of the leads not representative of an actual device.
Figure 4:
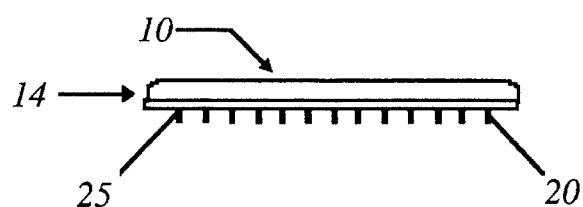
FIG. 4 is a side view of the pin grid array integrated circuit package of FIG. 3.

Referring initially to FIGS. 1–4, a ball grid array (BGA) integrated circuit package 12 and a pin grid array (PGA) integrated circuit package 14 are shown. The figures throughout the application are illustrative of the invention and are not drawn to scale. As shown in FIGS. 3–4, the terminals 20 of the PGA integrated circuits 14 are called "pins". Referring to FIGS. 1–2, the terminals 22 of the BGA integrated circuits 12 are called "balls" or "bumps". The terminals of integrated circuits (ICs) which include solder bumps on a surface thereof, such as those bumps formed by the direct chip attach (C4/DCA) process are also referenced as "bumps". Throughout the application, the terms "balls", "bumps", and "pins" will be referenced as "leads" 25 to avoid confusion. Additionally, PGA, BGA, C4/DCA ICs, and like integrated circuits which include leads on a surface thereof, will be referenced as the "Device-Under-Test", "DUT", or device 10 throughout the application.

Figure 5:
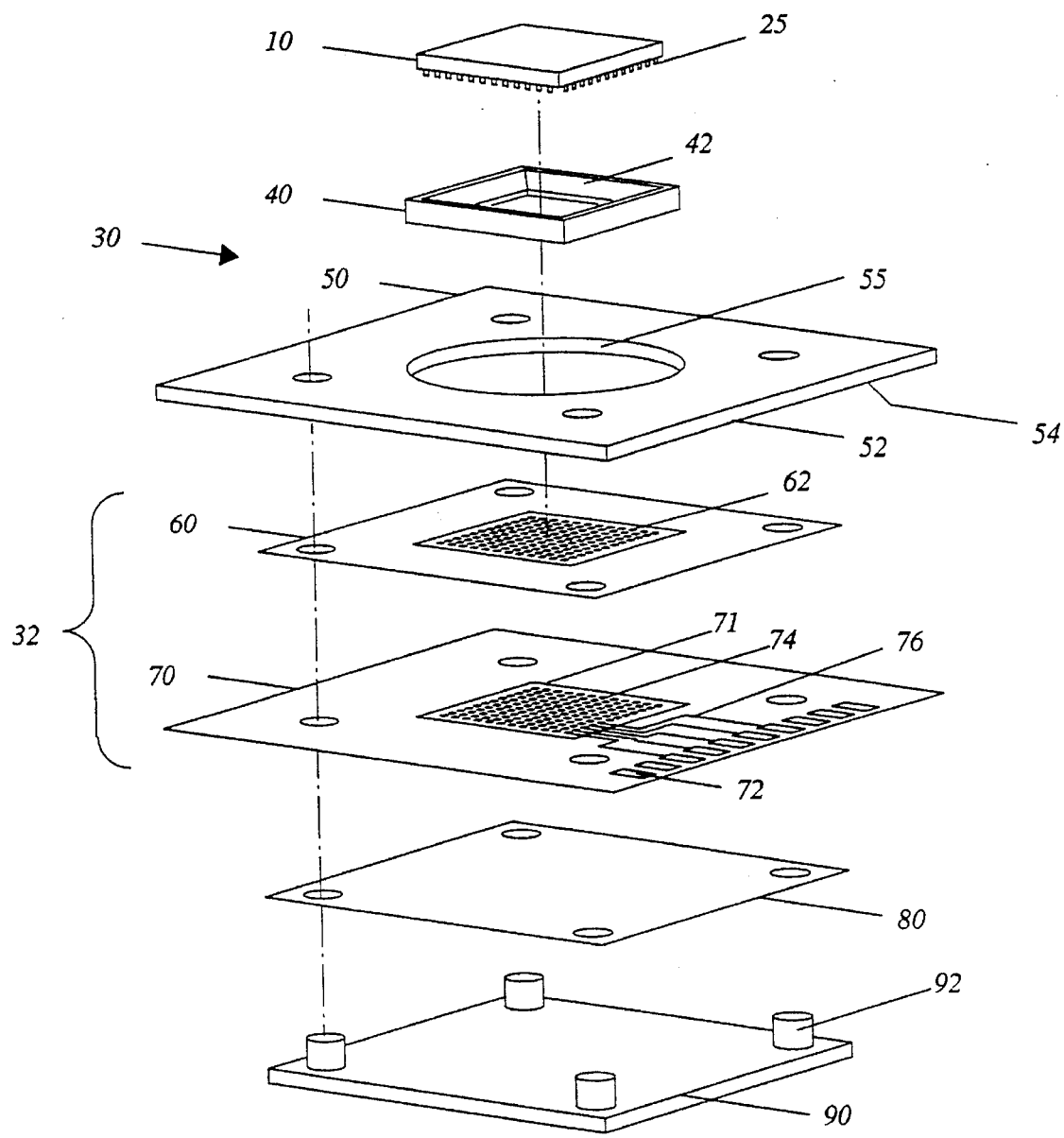
FIG. 5 is an exploded isometric view of the integrated circuit test assembly in accordance with the preferred embodiment of the present invention.

Turning now to FIG. 5, in a preferred embodiment, a test assembly 30 for testing integrated circuits is shown. The test assembly includes a test fixture 32 for connecting a plurality of leads 25 of a device 10 to a test board 50. The test assembly 30 generally includes 1) a guide plate 40, 2) a test board 50 (e.g. printed circuit board), 3) a test fixture 32 comprising an alignment plate 60 and a test plate 70 with bumped finger pads 72 to electrically connect the test plate 70 to the active side 52 of the test board 50, 4) a cushioning means 80 and 5) a bottom pressure plate 90. The circuitry on the test plate 70 is only partially illustrated in the drawings for clarity. The parts are layered one on top the other and preferably held under pressure in alignment by four pegs 92 attached to the bottom pressure plate 90. The four pegs 92 are inserted through alignment holes in the test board 50, the alignment plate 60, the test plate 70, and the cushioning means 80.

Figure 6:
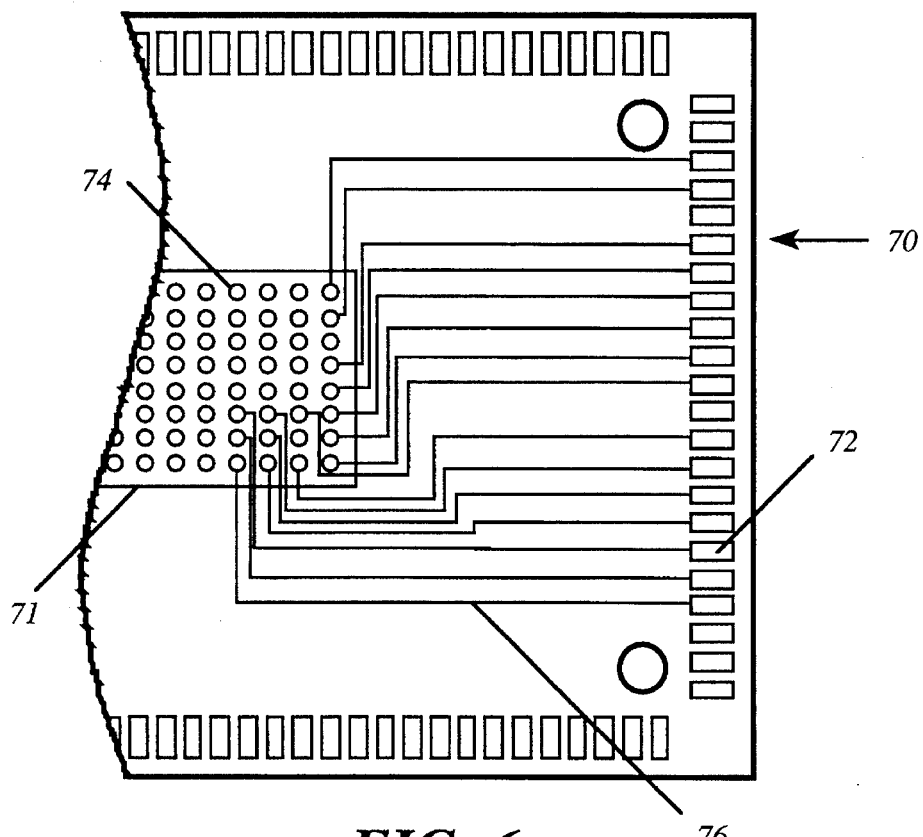
FIG. 6 is a top plan view of the test plate in accordance with the preferred embodiment of the present invention, showing only a partial representation of the circuitry for clarity.
Figure 7:
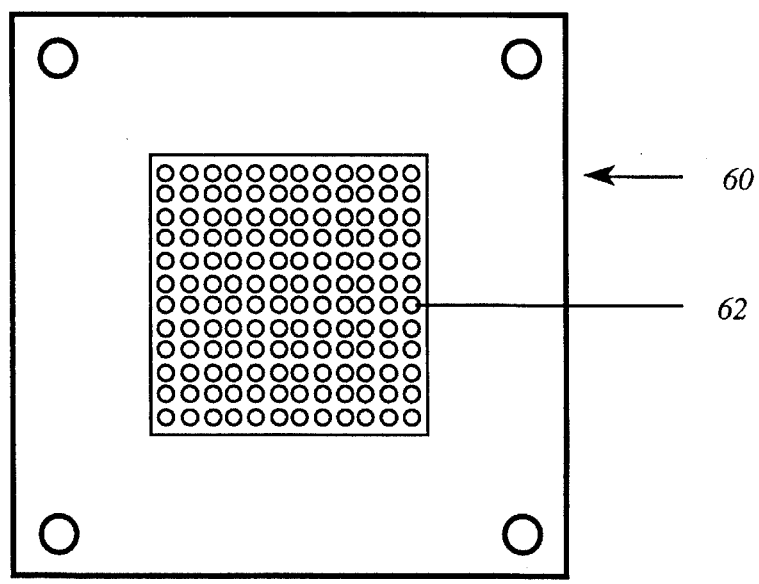
FIG. 7 is a top plan view of the alignment plate in accordance with the preferred embodiment of the present invention.

In a preferred embodiment, the test fixture 32 basically includes two plates. The first is a test plate 70 having a plurality of test points 74 corresponding to the leads 25 of the device 10, shown in FIG. 6. The test points 74 are electrically connected to the test board 50. The second is an alignment plate 60 mounted on top of the test plate 70, shown in FIG. 7. The alignment plate 60 has a series of perforations 62 corresponding to the test points 74, such that the leads 25 of the device 10 fit securely into the perforations 62 and contact the test points 74.

The test plate 70 is preferably fabricated of flex material (e.g. DuPont® Kapton®). The test plate 70 may be fabricated of DuPont® Kapton®, or any suitable flexible substrate or material known in the art which could provide pressure fitted test points. The test plate 70 includes a series of runners 76, or electrical traces, extending from the test points 74 on the test plate 70 to a series of bumped finger pads 72 on the test plate 70. The runners 76 are fabricated of conventional electrically conductive substances, such as copper. These runners 76 are protected by the alignment plate 60 covering the top surface thereof. The bumped finger pads 72 of the test plate 70 are electrically connected to and pressure fitted against a corresponding series of bumped finger pads 54 on an active side 52 of the test board 50, shown in FIG. 8. Typically, the electrically conductive test points 74 are arranged in a grid pattern to correspond to and register with the lead pattern on the device 10. However, the invention should not be limited by a particular layout of the test points 74, for such an arrangement would depend on whatever pattern exists on the device 10.

The alignment plate 60 is also preferably fabricated of flex material and covers the runners 76, thereby electrically insulating them. The alignment plate 60, shown in FIG. 5, fitted between the test plate 70 and the active side 52 of the test board 50, is used to precisely align the device 10 onto the test points 74 of the test plate 70. The alignment plate 60 is preferably fabricated of flex material (e.g. DuPont® Kapton®) with a series of perforations 62 which correspond with the device leads 25. These perforations 62 act like a series of impressions or dimples into which the leads 25 fit, locking the leads 25 into alignment onto the test points 74 of the test plate 70. The alignment plate 60 also serves as a protective non-conductive cover over the runners 76 of the test plate 70. However, the alignment plate 60 does not cover the bumped finger pads 72 of the test plate 70 so that these pads 72 may contact corresponding pads 54 on the test board 50.

The test fixture 32 is removably mounted to the test board 50 (the underside shown in FIG. 8) by means of a pressure plate 90, such that the bumped finger pads 72 of the test plate 70 are pressure fitted against the series of bumped finger pads 54 on the active side 52 of the test board 50. The four posts 92 on the pressure plate 90 serve to align the assembly 30 and secure the parts (i.e., cushioning means 80, test plate 70, alignment plate 60, test board 50) together providing the pressure for alignment so when all of the parts are assembled, the bumped finger pads 72, 54 line up correctly.

The test fixture 32 preferably includes a cushioning means 80, such as a rubber pad, between the pressure plate 90 and the test plate 70 to allow the test points 74 of test plate 70 to mold slightly around the leads 25 when the device 10 is pressed against the test fixture 32.

Figure 8:
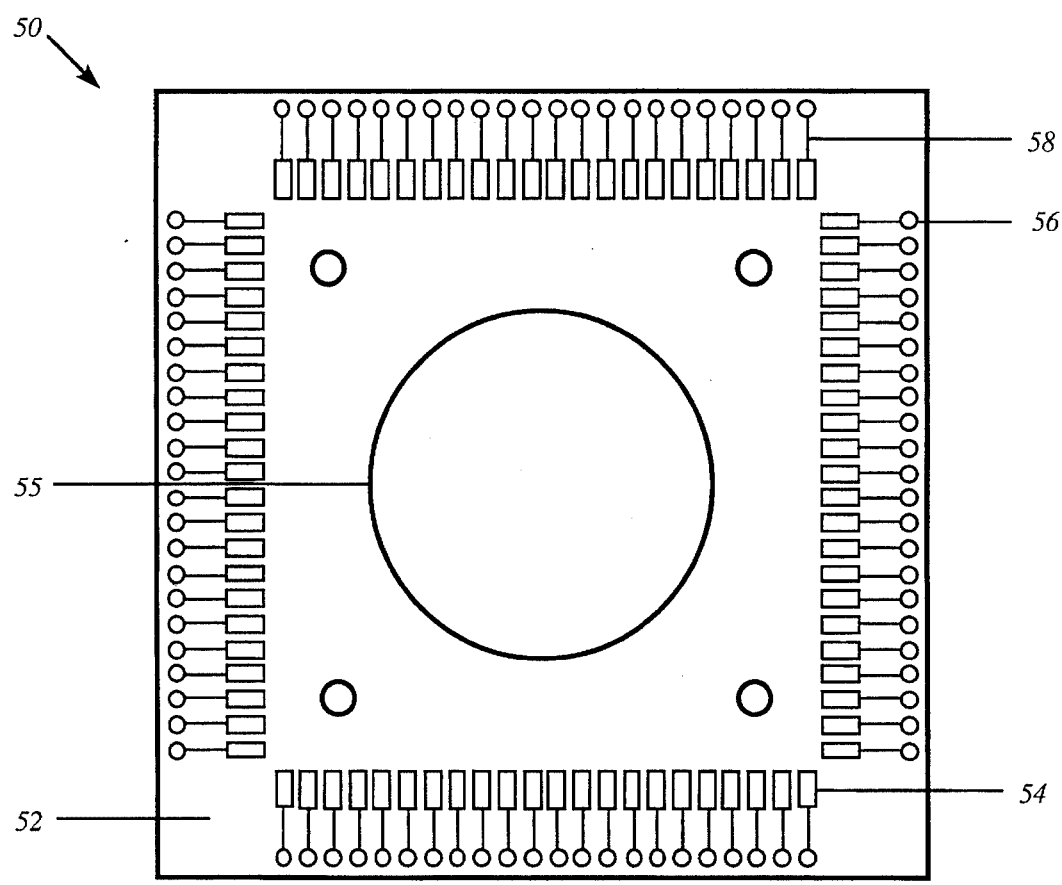
FIG. 8 is a bottom plan view of the test board in accordance with the preferred embodiment of the present invention.

Turning now to FIG. 8, the test board 50 is preferably a printed circuit board having an active bottom side 52. The test fixture 32 is removably mounted to the active bottom side 52 of the test board 50. The test assembly 30 may use the same printed circuit board that the current pogo test fixtures use. However, the test assembly 30 would not need the cubical socket populated with pogo pins. Instead, a test plate 70, fabricated of flex material, shown in FIG. 4, is used to contact the leads 25 for testing the device 10. The test plate 70 is fabricated with electrically conductive test points 74 that mirror the leads 25 on the bottom side of the device 10. These points 74 run out to bumped finger pads 72 that are pressure fitted up against identical bumped finger pads 54 on the bottom (active) side 52 of the test board 50. The bumped finger pads 54 are connected by circuit traces 58 to a plurality of interconnection ports 56 which are used to connect the test board 50 to the host test computer (not shown). The test board 50 permits electrical connection to the bumped finger pads 72 of the test plate 70. The test board 50 may be a relatively simple printed circuit board which enables alterable test connections to be made to a device-under-test 10 and serves as the interface between the device 10 and the host test computer (not shown) executing the test.

In a preferred embodiment of the invention, the test fixture 32 further includes a guide plate 40, which is a non-conductive frame member 42 having a circumference slightly larger than the device 10. The guide plate 40 is removably mounted on top of the test board 50 for roughly guiding the device 10 through a central opening 55 within the test board 70 onto the alignment plate 60 of the test fixture 32.

In operation, a device 10 is inserted into the test assembly 30 by an insertion device (not shown) such as a vacuum operated test handler. The insertion device may be of any type well-known in the art as long as the device 10 is inserted vertically into the test assembly 30. The device 10 has a plurality of leads 25 which face the test points 74. The insertion device inserts the device 10 into the assembly 30 by passing the device 10 through the guide plate 40 and through the opening 55 within the test board 50 onto the alignment plate 60. The leads 25 of the device 10 would fit into the perforations 62 of the alignment plate 60 and contact the test points 74 of the test plate 70 underneath. Electrical contact would thus be made along the test points 74 through the runners 76 to the bumped finger pads 72 of the test plate 70 to the bumped finger pads 54 of the test board 50 and ultimately to the host computer for testing. Once the test is complete, the device 10 is removed from the test assembly 30 and automatically sorted according to the test results.

Generally described, the preferred method for testing a plurality of leads 25 of a device 10 with a test board 50 according to the invention includes the steps of 1) inserting the device 10 onto a test fixture 32; wherein the test fixture 32 comprises a test plate 70 having a plurality of test points 74 corresponding to the leads 25 of the device 10, the test points 74 electrically connected to the test board 50; 2) aligning the leads 25 of the device 10 onto the test points 74 of the test fixture 32, wherein each test point 74 contacts a corresponding lead 25; and 3) testing the device 10.

In a preferred embodiment, the test plate 70 comprises flex material and the test points 74 are electrically connected to the test board 50 through a series of runners 76 extending from the test points 74 on the test plate 70 to a series of bumped finger pads 72 on the test plate 70. The bumped finger pads 72 of the test plate 70 are electrically connected to a series of bumped finger pads 54 on an active side 52 of the test board 50. The test board 50 comprises a printed circuit board having an active bottom side 52, wherein the test fixture 32 is removably mounted to the bottom active side 52 of the test board 50.

The alignment step includes aligning the leads 25 of the device 10 with an alignment plate 60 fabricated of flex material mounted, either removably or permanently affixed, on top of the test plate 70. The alignment plate 60 has a plurality of perforations 62 corresponding with the test points 74 of the test plate 70, so that the leads 25 of the device 10 fit securely into the perforations 62 and contact the test points 74. The alignment plate 60 covers and electrically insulates the runners 76.

The insertion step includes inserting the device 10 with an insertion means, such as an automated material handler (not shown) or manually, onto the test fixture 32 with the leads 25 of the device 10 facing the test points 74.

The method may further include, prior to testing the device, a step of inserting the entire test assembly (device 10, test fixture 32, test board 50, cushioning means 80, pressure plate 90), or portions thereof, into a temperature chamber for temperature variation testing in accordance with device operating specifics. Variations of heat or cold may be applied to test the device while in the assembly without harming the test components.

The method may further include the step of guiding the device 10 onto the test points 74 by a frame member 42 removably mounted on top of the test board 50, having a circumference slightly larger than the device 10, for roughly guiding the device 10 through the central opening 55 within the test board 50 onto the alignment plate 60 of the test fixture 32.

A number of advantages arise from practice of this method and apparatus for testing integrated circuits. For example, if the test site 71, which is the surface area on which the test points 74 are located, becomes contaminated or soiled, it could be readily cleaned with alcohol or other cleaning agent. If the test plate 70 gets worn or damaged, it could be replaced immediately with a newly fabricated test plate at a low cost compared to the replacement of pogo pins and/or sockets.

Since the test points 74 are printed pads on a test plate 70, the limit of the pitch of the grid array that can be tested is determined by flex circuit technology which can reach below 20 milli-inches (0.508 mm).

Furthermore, if the device 10 did not have the entire grid array filled with leads 25 or if the leads 25 were arranged in a circular, triangular, or any of a number of patterns, then the test plate 70 could readily be fabricated with those test points 74 needed to correspond with the device 10 pin pattern.

Finally, since the material used for the test site 71 is able to withstand higher temperatures than the maximum allowable temperatures for pogo pin sockets, the entire test assembly 30 may be used in conjunction with burn-in ovens for chip burn-in, or like processes.

Thus, it is apparent that there has been provided, in accordance with the invention, a method and apparatus for testing small pitch devices. While the invention has been described and illustrated with reference to specific embodiments thereof, it is not intended that the invention be limited to these illustrative embodiments. Those skilled in the art will recognize, after review of the foregoing description, that variations and modifications differing from the illustrative embodiments are possible. It is intended that all such variations and modifications as fall within the spirit and scope of the invention be included within the appended claims.

What is claimed is:

1. A test assembly for connecting a plurality of leads of a device to a test board, the test assembly comprising:

the test board;

a flexible test fixture, including:

a flexible test plate having a plurality of test points corresponding to said leads of said device, said test points electrically connected to said test board; and a flexible alignment plate positioned on top of said flexible test plate, said flexible alignment plate comprising a series of perforations corresponding to said test points, wherein said leads of said device fit securely into said perforations and contact said test points; and a cushioning means positioned beneath said flexible test plate for allowing said test points of said flexible test plate to mold slightly around said leads of said device when said device is pressed against said flexible test fixture.

2. The test assembly of claim 1, wherein said flexible test plate is fabricated of a flex material.

3. The test assembly of claim 1, wherein said flexible test fixture comprises a series of runners extending from said test points on said flexible test plate to a series of bumped finger pads on said flexible test plate, said bumped finger pads of said flexible test plate electrically connected to a series of bumped finger pads on an active side of said test board.

4. The test assembly of claim 1, wherein said flexible alignment plate is fabricated of a flex material.

5. The test assembly of claim 3, wherein said flexible alignment plate covers said runners, thereby electrically insulating said runners.

6. The test assembly of claim 3, wherein said flexible test fixture is removably mounted to said test board by means of a pressure plate, such that said bumped finger pads of said flexible test plate are pressure fitted against and electrically connected to said series of bumped finger pads on said active side of said test board.

7. The test assembly of claim 1, wherein said test board comprises a printed circuit board having an active bottom side, wherein said flexible test fixture is removably mounted to said active bottom side of said test board, and wherein said device is guided through a central opening within said test board onto said flexible alignment plate of said flexible test fixture.

8. The test assembly of claim 7, further comprising a guiding means removably mounted on top of said test board for roughly guiding said device through said central opening within said test board onto said flexible alignment plate of said flexible test fixture, wherein said guiding means comprises a non-conductive frame member having a circumference slightly larger than said device.

* * * * *